(12) United States Patent
Wu et al.

(10) Patent No.: US 12,501,560 B2
(45) Date of Patent: Dec. 16, 2025

(54) FLEXIBLE DISPLAY APPARATUS

(71) Applicant: Qisda Corporation, Taoyuan (TW)

(72) Inventors: Shin-Hao Wu, Taoyuan (TW); Han-Kuang Ho, Taoyuan (TW)

(73) Assignee: Qisda Corporation, Taoyuan (TW)

( * ) Notice: Subject to any disclaimer, the term of this patent is extended or adjusted under 35 U.S.C. 154(b) by 273 days.

(21) Appl. No.: 18/138,186

(22) Filed: Apr. 24, 2023

(65) Prior Publication Data

US 2024/0049410 A1 Feb. 8, 2024

(30) Foreign Application Priority Data

Aug. 2, 2022 (CN) .......................... 202210920551.4

(51) Int. Cl.
 *H05K 5/02* (2006.01)
(52) U.S. Cl.
 CPC ......... *H05K 5/0217* (2013.01); *H05K 5/0247* (2013.01)
(58) Field of Classification Search
 CPC .. H05K 5/0017; H05K 5/0217; H05K 5/0247; G06F 1/1624
 USPC ................. 361/807, 809, 810, 728
 See application file for complete search history.

(56) References Cited

U.S. PATENT DOCUMENTS

| | | | |
|---|---|---|---|
| 9,711,752 B2 * | 7/2017 | Lee | H05K 1/0281 |
| 2013/0114193 A1 * | 5/2013 | Joo | G06F 1/1601 |
| | | | 361/679.01 |
| 2014/0268584 A1 * | 9/2014 | Song | G06F 1/1601 |
| | | | 361/728 |
| 2020/0305294 A1 * | 9/2020 | Yamaguchi | G09F 9/00 |

FOREIGN PATENT DOCUMENTS

| | | |
|---|---|---|
| CN | 105578091 B | 11/2018 |
| CN | 105144052 B | 2/2019 |

\* cited by examiner

*Primary Examiner* — Hung S. Bui

(57) ABSTRACT

A flexible display apparatus includes a flexible display panel and a first shape-memory metal element. The flexible display panel has a long side direction. The first shape-memory metal element has a first long axis, one end of the first long axis is anchored to a first position of the flexible display panel, and the other end of the first long axis is anchored to a second position of the flexible display panel. Wherein, the first position and the second position are arranged along a first connecting direction parallel to the long side direction of the flexible display panel. When the first shape-memory metal element is at a first temperature, a first deformation occurs along the first long axis, and drives the flexible display panel to have a first curvature radius.

13 Claims, 14 Drawing Sheets

FLEXIBLE DISPLAY APPARATUS

This application claims the benefit of People's Republic of China application Serial No. 202210920551.4, field at Aug. 2, 2022, the subject matter of which is incorporated herein by reference.

BACKGROUND OF THE DISCLOSURE

Field of the Disclosure

The disclosure relates in general to a display apparatus and more particularly to a flexible display.

Description of the Related Art

Presently, although a traditional flat-panel display apparatus allows multiple people to watch at once, but it cannot provide all user the best viewing angles, because its screen only having a single display plane. In other words, the traditional flat-panel display apparatus cannot take into account multiple people's viewing and good visual quality at the same time. A flexible display apparatus has a flexible display panel that can be bent/folded, the curvature of the display surface of the flexible display panel can be changed by bending or folding by external force, so that the user can get a good view from any angle with good visual quality.

However, how to control the bending/folding deformation degree of the display surface of the flexible display panel to achieve the required curvature and/or angle, and how to make it have the mechanical reliability of returning to its original shape after repeated bending has become the important topics in the related technical field.

Therefore, there is a need to provide an advanced flexible display apparatus to overcome the drawbacks of the prior art.

SUMMARY OF THE DISCLOSURE

One embodiment of the present disclosure is to provide a flexible display apparatus, wherein the flexible display apparatus includes a flexible display panel and a first shape-memory metal element. The flexible display panel has a long side direction. The first shape-memory metal element has a first long axis, one end of the first long axis is anchored to a first position of the flexible display panel, and the other end of the first long axis is anchored to a second position of the flexible display panel. Wherein, the first position and the second position are arranged along a first connecting direction panel parallel to the long side direction of the flexible display panel. When the first shape-memory metal element is at a first temperature, a first deformation occurs along the first long axis to drive the flexible display panel having a first curvature radius.

Another embodiment of the present disclosure provides a flexible display apparatus, wherein the flexible display apparatus includes flexible display panel, a plurality of first shape-memory metal elements and a plurality of second shape-memory metal elements. The flexible display panel has a long side direction. One of the plurality of first shape-memory metal elements has one end anchored to a first position of the flexible display panel and another end anchored to a second position of the flexible display panel. One of the second shape-memory metal elements has one end anchored to a third position of the flexible display panel and another end anchored to a fourth position of the flexible display panel. When at least portions of the plurality of first shape-memory metal elements and/or the plurality of second shape-memory metal elements are at a first temperature, a first deformation occurs on the at least portions of the plurality of first shape-memory metal elements and/or a second deformation occurs on the at least portions of the plurality of second shape-memory metal elements, to drive the flexible display panel having a first curvature radius along the long side direction of the flexible display panel.

According to the aforementioned embodiments, a flexible display apparatus is provided, which is equipped with at least one shape-memory metal element on a flexible display panel. One end of a long axis of the shape-memory metal element is anchored at a first position of the flexible display panel, and the other end of the long axis is anchored at a second position of the flexible display panel. The first position and the second position are arranged along a connecting direction of the flexible display panel parallel to an extending direction (long side direction) of the long axis. When the shape-memory metal element is at a first temperature, a first deformation occurs on the shape-memory metal element along the long axis to drive the flexible display panel having a first curvature radius. When the shape-memory metal element is at a second temperature, a second deformation occurs on the shape-memory metal element along the long axis to drive the flexible display panel having a second curvature radius. By this approach, the bending/bending deformation degree of the display surface of the flexible display panel can be controlled more precisely and diversely, and the required curvature and/or display angle can be obtained. In some embodiments, even a portion (such as the right side portion) of the flexible display panel is flat, the other side (for example, the right side) can be bent to have a curved deformation, so as to prevent the right side portion of the flexible display panel from being peeped by others.

In some other embodiments, elastic sheets and/or springs extending along the long side direction or perpendicular to the display direction of the flexible display panel can be further arranged to provide an elastic force making the flexible display panel having the mechanical reliability for returning to its original shape after repeated bending. Such that the required curvature and/or display angle can be obtained.

BRIEF DESCRIPTION OF THE DRAWINGS

The above and other aspects of the disclosure will become better understood with regard to the following detailed description of the preferred but non-limiting embodiment(s). The following description is made with reference to the accompanying drawings.

DETAILED DESCRIPTION OF THE DISCLOSURE

The present disclosure provides a flexible display apparatus to control the bending/folding deformation degree of the display surface of the flexible display panel to achieve the required curvature and/or display angle. The above and other aspects of the disclosure will become better understood by the following detailed description of the preferred but non-limiting embodiment(s). The following description is made with reference to the accompanying drawings:

Several embodiments of the present disclosure are disclosed below with reference to accompanying drawings. However, the structure and contents disclosed in the embodiments are for exemplary and explanatory purposes only, and the scope of protection of the present disclosure is not limited to the embodiments. It should be noted that the present disclosure does not illustrate all possible embodiments, and anyone skilled in the technology field of the disclosure will be able to make suitable modifications or changes based on the specification disclosed below to meet actual needs without breaching the spirit of the disclosure. The present disclosure is applicable to other implementations not disclosed in the specification.

Figure 1A:
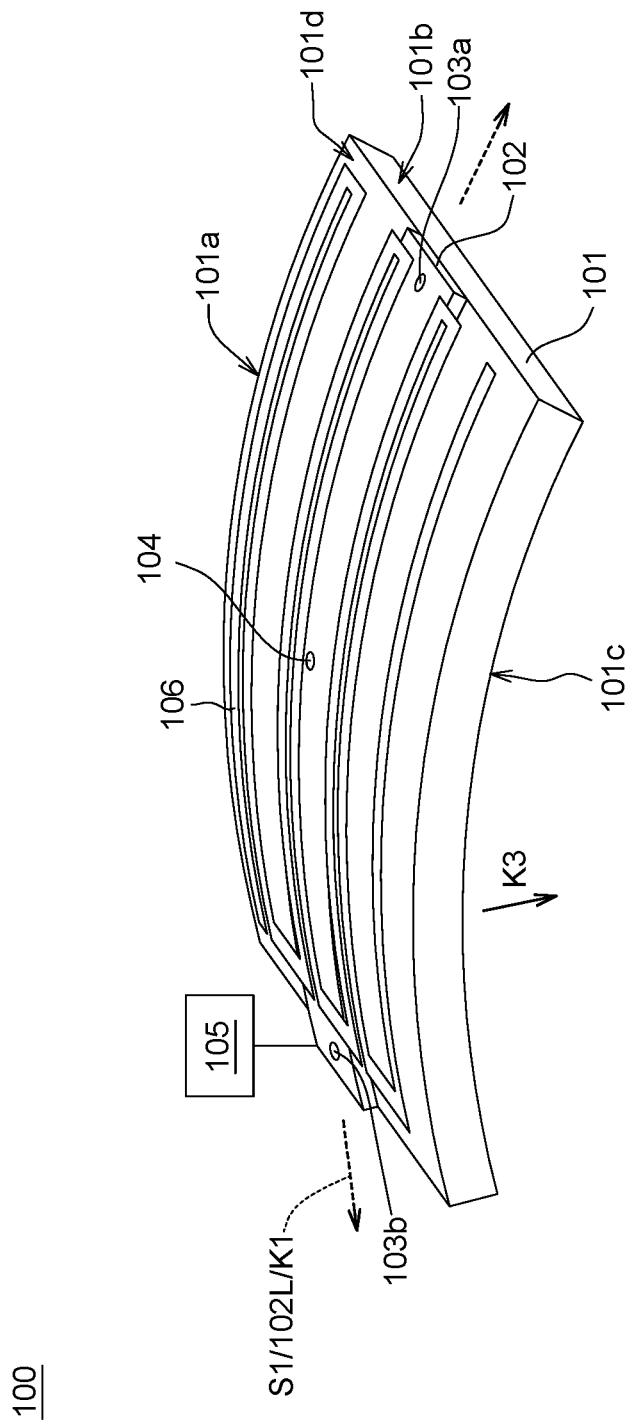
FIG. 1A is a perspective view illustrating a flexible display apparatus at normal temperature according to one embodiment of the present disclosure.
Figure 1B:
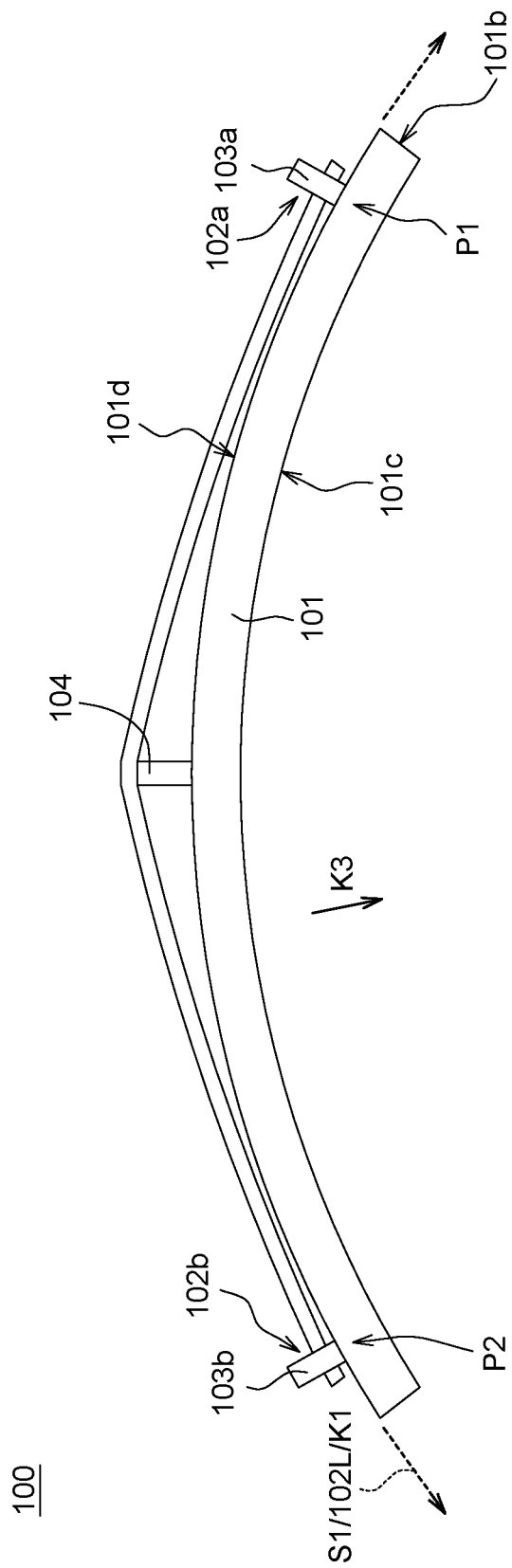
FIG. 1B is a cross-sectional view illustrating the flexible display apparatus taking along the cutting line S1 as depicted in FIG. 1A.

FIG. 1A is a perspective view illustrating a flexible display apparatus 100 at normal temperature (for example, 25° C.) according to one embodiment of the present disclosure; and FIG. 1B is a cross-sectional view illustrating the flexible display apparatus 100 taking along the cutting line S1 as depicted in FIG. 1A. Wherein the flexible display apparatus 100 includes a flexible display panel 101 and a first shape-memory metal element 102.

In some embodiments of the present disclosure, the flexible display panel 101 can be an organic light-emitting diode (OLED) panel, a micro-light-emitting diode (Micro-LED) panel, an electronic paper display (EPD) panel or an E-Ink display panel. In this embodiment, the flexible display panel 101 may be a rectangular OLED panel, which has a long side 101a and a short side 101b perpendicular to the long side 101a.

In some embodiments of the present disclosure, the first shape-memory metal element 102 can be a strip structure, a line structure or a sheet structure, and is disposed on the back surface 101d of the flexible display panel 101 (that is, on the opposite side of the display surface 101c). In the present embodiment, as shown in FIGS. 1A and 1B, the first shape-memory metal element 102 may be a strip-like metal sheet or plate. The first shape-memory metal element 102 has a first long axis 102L, one end 102a of the first long axis 102L is anchored at a first position P1 of the flexible display panel 101, and the other end 102b of the first long axis 102L is anchored at a second position P2 of the flexible display panel 101. Wherein, the first position P1 and the second position P2 are arranged along a connecting direction K1 parallel to an extending direction (long side direction) of the long side 101a of the flexible display panel 101.

In detail, one end 102a of the first major axis 102L of the first shape-memory metal element 102 is anchored at the first position P1 of the flexible display panel 101 by a first end-anchoring member 103a; The other end 102b of the first major axis 102L is anchored at the second position P2 by a second end-anchoring member 103b (as shown in FIG. 1B). In some embodiments of the present disclosure, the first end-anchoring member 103a and the second end-anchoring member 103b may be a rivet, a bolt, glue, a magnet or other means to fix (for riveting, locking, adhesion or magnetic attraction) the first shape-memory metal element 102 on the back surface 101d of the flexible display panel 101.

In addition, the flexible display apparatus 100 further includes at least one first main support member 104, disposed between the first end-anchoring member 103a and the second end-anchoring member 103b, for supporting the first shape-memory metal element 102. In some embodiments of the present disclosure, the first main support member 104 may be a protruding part, bump, pillar or other suitable structure protruding from or fixed on the back surface 101d of the flexible display panel 101. Any structure that supports the first shape-memory metal element 102 away from the back surface 101d of the flexible display panel 101 in a movable manner without affecting the stretched or contracted state of the first shape-memory metal element 102 may not breach the spirit of the first main support member 104 described in this disclosure.

In the present embodiment, as shown in FIG. 1B, when the first shape-memory metal element 102 is at a normal temperature (for example, a normal temperature of 25° C.), the flexible display panel 101 is in a curved state. The first shape-memory metal element 102 extends only along the first long axis 102L to either provide bending stress to the flexible display panel 101, or not provide any stress thereto.

Figure 1C:
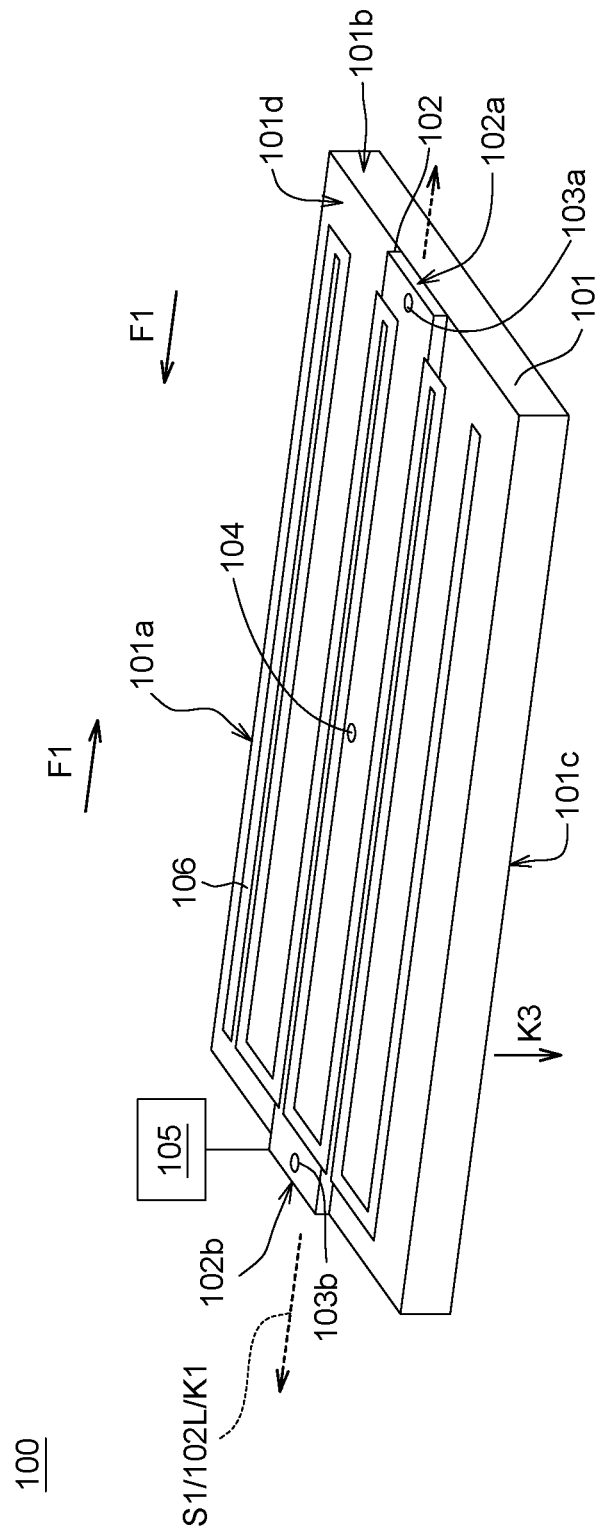
FIG. 1C is a perspective view illustrating the flexible display apparatus at a first temperature.
Figure 1D:
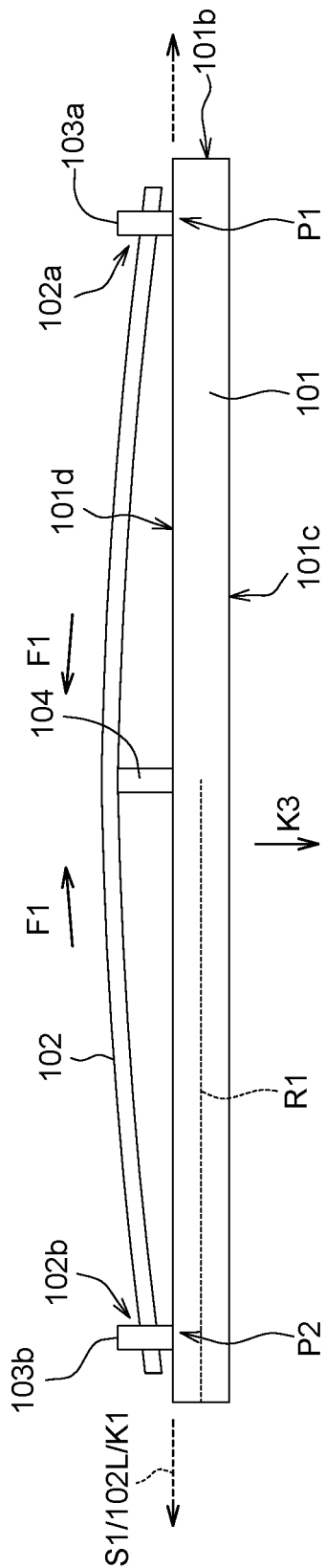
FIG. 1D is a cross-sectional view illustrating the flexible display apparatus taking along the cutting line S1 as depicted in FIG. 1C.

FIG. 1C is a perspective view illustrating the flexible display apparatus 100 at a first temperature (for example, a normal temperature of 35° C.); and FIG. 1D is a cross-sectional view illustrating the flexible display apparatus 100 taking along the cutting line S1 as depicted in FIG. 1C. When the temperature of the first shape-memory metal element 102 changes, for example, when the first shape-memory metal element 102 is at the first temperature (for example, 35° C.), a first deformation occurs on the first shape-memory metal element 102 along the first long axis 102L and provides a first stretching force F1 to drive the flexible display panel 101 to have a first curvature radius R1. In the present embodiment, the first stretching force F1 makes the first curvature radius R1 of the flexible display panel 101 zero. At this time, the display surface 101c of the flexible display panel 101 remains flat.

When the temperature of the first shape-memory metal element 102 returns to the normal temperature (i.e., 25° C.), the first shape-memory metal element 102 returns to its original shape from the first deformation, and provides bending stress to the flexible display panel 101. At this time, the curvature radius of the flexible display panel 101 can return to the initial curved state (as shown in FIG. 1A and FIG. 1B).

Figure 2A:
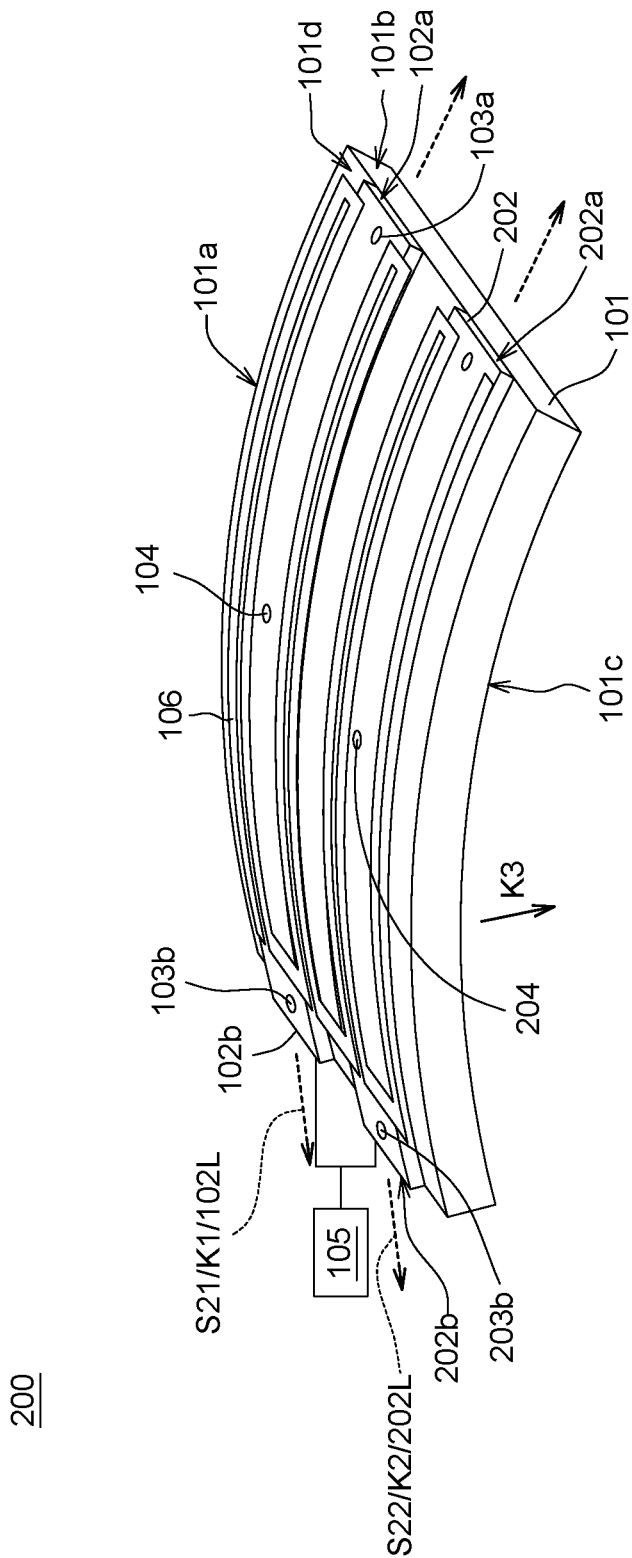
FIG. 2A is a perspective view illustrating a flexible display apparatus at normal temperature according to another embodiment of the present disclosure.
Figure 2B:
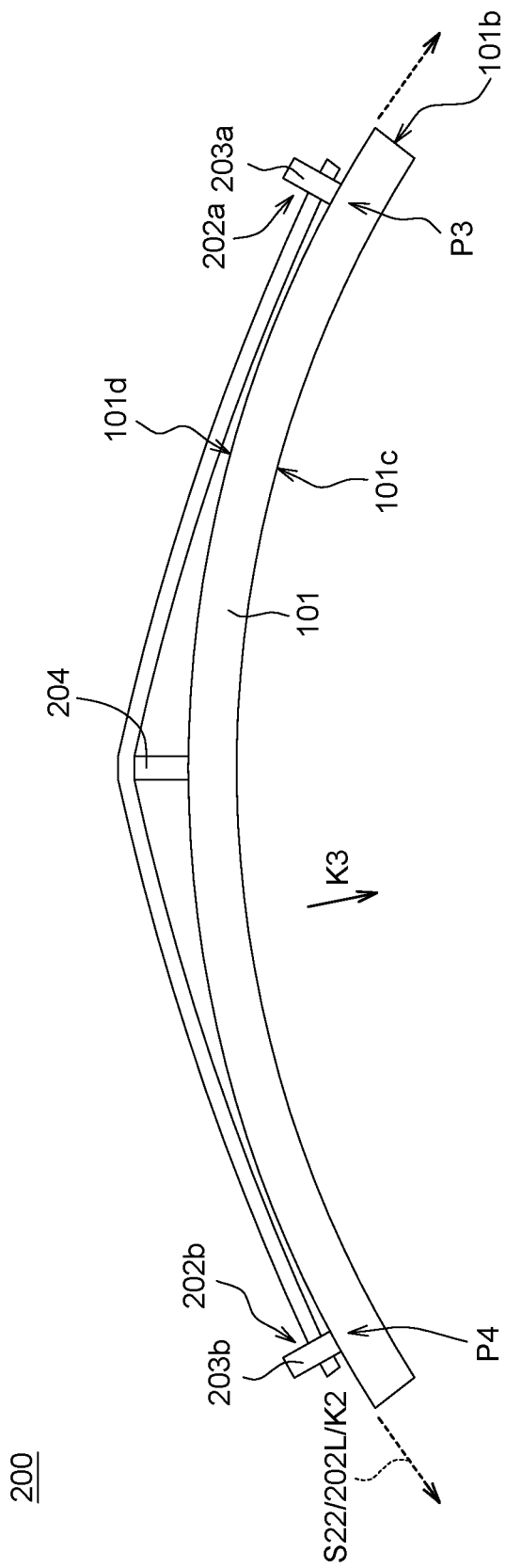
FIG. 2B is a cross-sectional view illustrating the flexible display apparatus taking along the cutting line S21 as depicted in FIG. 2A.

FIG. 2A is a perspective view illustrating a flexible display apparatus 200 at normal temperature according to another embodiment of the present disclosure; and FIG. 2B is a cross-sectional view illustrating the flexible display apparatus 200 taking along the cutting line S21 as depicted in FIG. 2A. The structure of the flexible display apparatus 200 is generally similar to that of the flexible display apparatus 100, the difference is that the flexible display apparatus 200 further includes at least one second shape-memory metal element 202 disposed on the back surface 101d of the flexible display panel 101. The second shape-memory metal element 202 can be arranged up and down along the direction of a second long axis 202L (as shown in FIG. 2A) or arranged left and right along the direction of the second long axis 202L (not shown) on the back surface 101d of the flexible display panel 101.

In the present embodiment, the second shape-memory metal element 202 is disposed on the back surface 101d of the flexible display panel 101. Wherein, the second shape-memory metal element 202 has the second long axis 202L, one end 202a of the second long axis 202L is anchored to a third position P3 of the flexible display panel 101 through a third end-anchoring member 203a, and the other end 202b of the second long axis 202L is anchored to a fourth position P4 of the flexible display panel 101 through a fourth end-anchoring member 203b. The third position P3 and the fourth position P4 are arranged along a connecting direction K2 parallel to the extending direction (long side direction) of the long side 101a of the flexible display panel 101 (as shown in FIG. 2A).

In addition, the flexible display apparatus 200 further includes at least one second main support member 204 disposed between the third end-anchoring member 203a and the fourth end-anchoring member 203b for supporting the second shape-memory metal element 202. Since the materials, structures and arrangements of the third end-anchoring member 203a, the fourth end-anchoring member 203b and the second main support member 204 are respectively the same or similar to those of the first end-anchoring member 103a, the second end-anchoring member 103b and the first main support member 104, thus no more details thereof is redundantly described here.

As shown in FIG. 2B, when the second shape-memory metal element 202 maintains a normal temperature (i.e., 25° C.), the second shape-memory metal element 202 extends only along the second log axis 202L to either provide a bending stressor to the flexible display panel 101 or not provide any stress thereto.

Figure 2C:
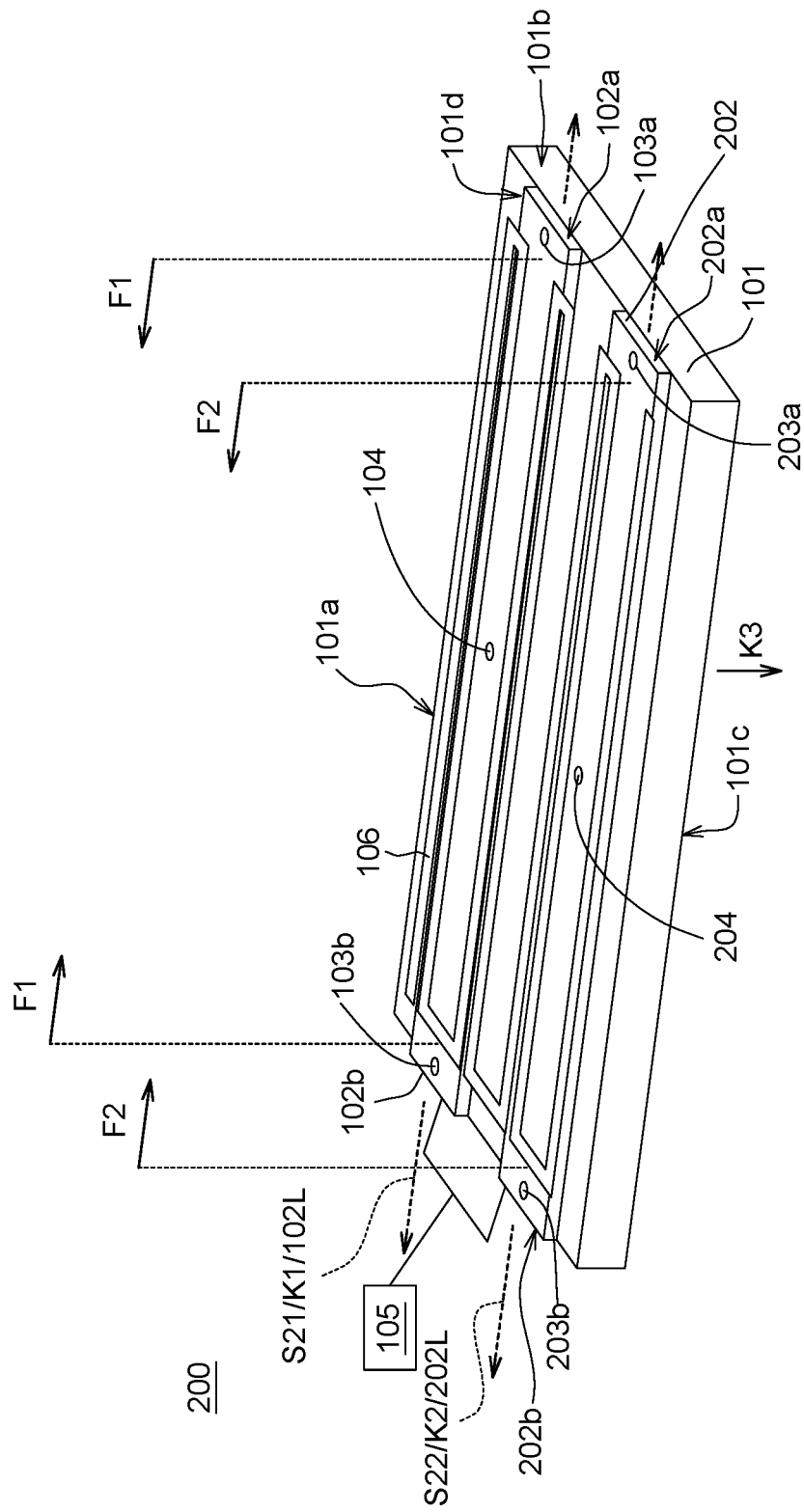
FIG. 2C is a perspective view illustrating the flexible display apparatus at the first temperature.
Figure 2D:
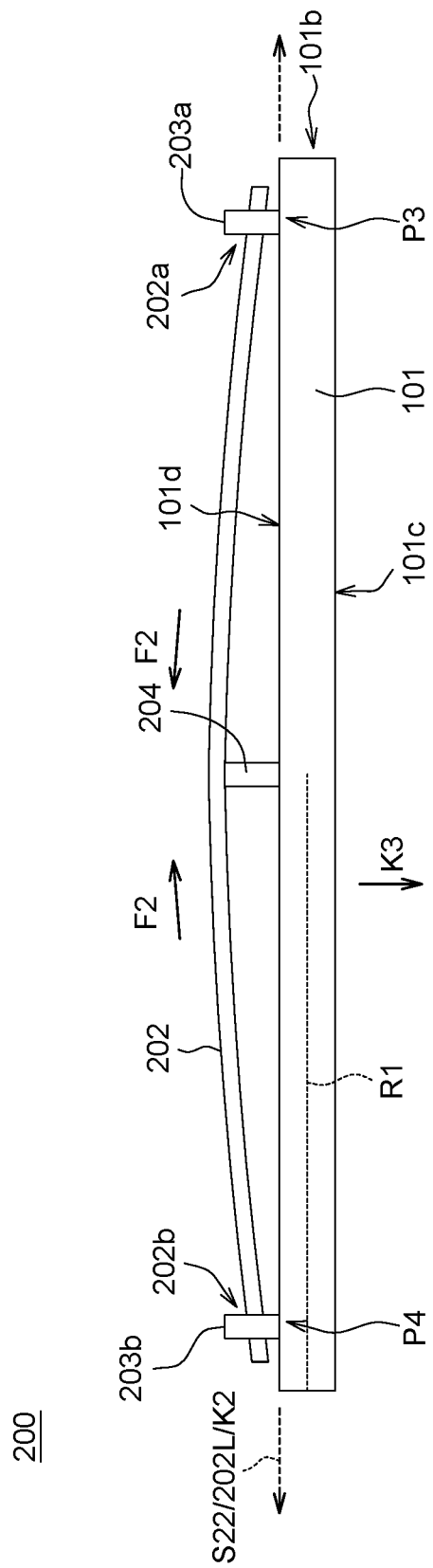
FIG. 2D is a cross-sectional view illustrating the flexible display apparatus taking along the cutting line S22 as depicted in FIG. 2C.

FIG. 2C is a perspective view illustrating the flexible display apparatus 200 at the first temperature (i.e., 35° C.); and FIG. 2D is a cross-sectional view illustrating the flexible display apparatus taking along the cutting line S22 as depicted in FIG. 2C. When the second shape-memory metal element 202 is at the first temperature (for example, 35° C.), a second deformation occurs on the second shape-memory metal element 202 along the second log axis 202L and provides a second stretching force F2 to drive the flexible display panel 101 to have the first curvature radius R1. In the present embodiment, the second stretching force F2 makes the first curvature radius R1 of the flexible display panel 101 zero. At this time, the display surface 101c of the flexible display panel 101 remains flat.

When the temperature of the second shape-memory metal element 202 returns to the normal temperature (i.e., 25° C.), the second shape-memory metal element 202 returns to its original shape from the second deformation, and provides bending stress to the flexible display panel 101. At this time, the curvature radius of the flexible display panel 101 can return to the initial curved state (as shown in FIG. 2A and FIG. 2B). Furthermore, when the second shape-memory metal element 202 is at a second temperature (for example, 30° C.), and when the first shape-memory metal element 102 is at the first temperature (i.e., 35° C.), a third deformation occurs on the second shape-memory metal element 202 along the second log axis 202L, and provides a tensile force to drive the flexible display panel 101 to have a second curvature radius (not shown) different from the first curvature radius.

Figure 2E:
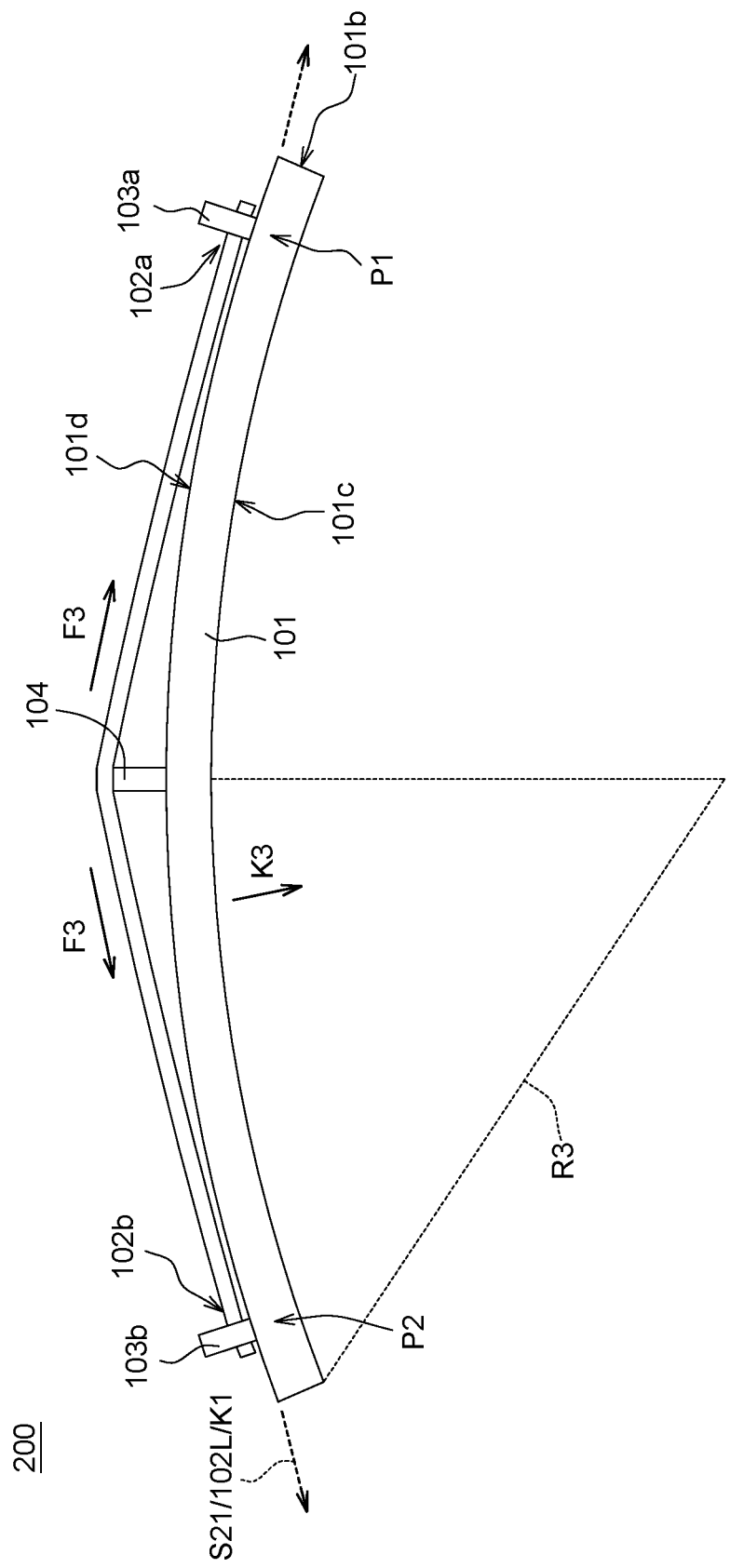
FIG. 2E is a cross-sectional view illustrating the flexible display apparatus at a third temperature taking along the cutting line S21 as depicted in FIG. 2A.
Figure 2F:
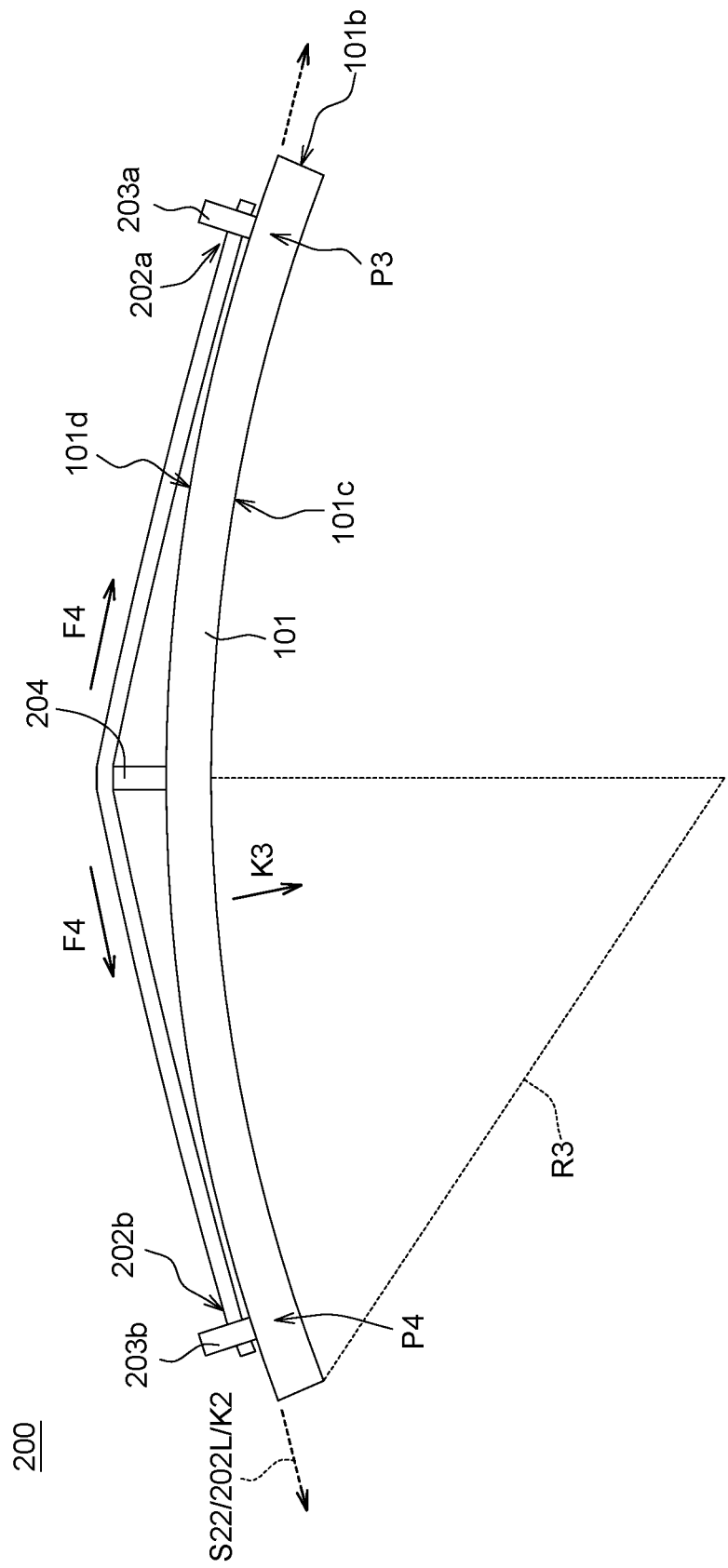
FIG. 2F is a cross-sectional view illustrating the flexible display apparatus at the third temperature taking along the cutting line S22 as depicted in FIG. 2A.

FIG. 2E is a cross-sectional view illustrating the flexible display apparatus 200 at a third temperature (for example, 28° C.) taking along the cutting line S21 as depicted in FIG. 2A; and FIG. 2F is a cross-sectional view illustrating the flexible display apparatus 200 at the third temperature (for example, 28° C.) taking along the cutting line S22 as depicted in FIG. 2A.

When the first shape-memory metal element 102 is at the third temperature (for example, 28° C.), a fourth deformation occurs on the first shape-memory metal element 102 along the first long axis 102L and provides a third stretching force F3; and when the second shape-memory metal element 202 is at the third temperature (for example, 28° C.), a fifth deformation occurs on the second shape-memory metal element 202 along the second log axis 202L, and provides a fourth stretching force F4 in combination to the third stretching force F3 to drive the flexible display panel 101 to have a third curvature radius R3 less than the first curvature radius R1.

In some embodiments of the present disclosure, the flexible display apparatus 100 (or 200) may optionally include a power supply 105 to provide current passing through the first shape-memory metal element 102 and/or the second shape-memory metal element 202 (or passing through a resistance wire (not shown) adjacent to the back surface 101d of the flexible display panel 101) to make the temperature of the first shape-memory metal element 102 and/or the second shape-memory metal element rising from the normal temperature (i.e., 25° C.) to the first temperature (e.g., 35° C.), the second temperature (e.g., 30° C.), and/or the third temperature (e.g., 28° C.).

In some embodiments of the present disclosure, the flexible display apparatus 100 (or 200) may optionally include a cooler 106, which has a cooling pipeline adjacent to the back surface 101d of the flexible display panel 101, for reducing the temperature of the first shape-memory metal element 102 and/or the second shape-memory metal element 202 from the first temperature (e.g., 35° C.) down to the normal temperature (e.g., 25° C.), so that the flexible display panel 101 can return to the curved state with the first curvature radius R1; or to adjust the temperature of the first shape-memory metal element 102 and/or the second shape-memory metal element 202 from the first temperature (e.g., 35° C.) down to the second temperature (e.g., 30° C.) and/or the third temperature (e.g., 28° C.), so as to make the flexible display panel 101 having a curvature radius (not shown) smaller than the first curvature radius R1.

However, it should be appreciated that the number of the shape-memory metal element in the flexible display apparatus 100 (or 200) is not limited to these regards. For example, the flexible display apparatus 100 (or 200) may not only include one single first shape-memory metal element 102 or one single second shape-memory metal element 202. In some embodiments, the flexible display apparatus 100 (or 200) may include a plurality of first shape-memory metal elements 102 (not shown) or a plurality of second shape-memory metal elements 202 (not shown).

Figure 3:
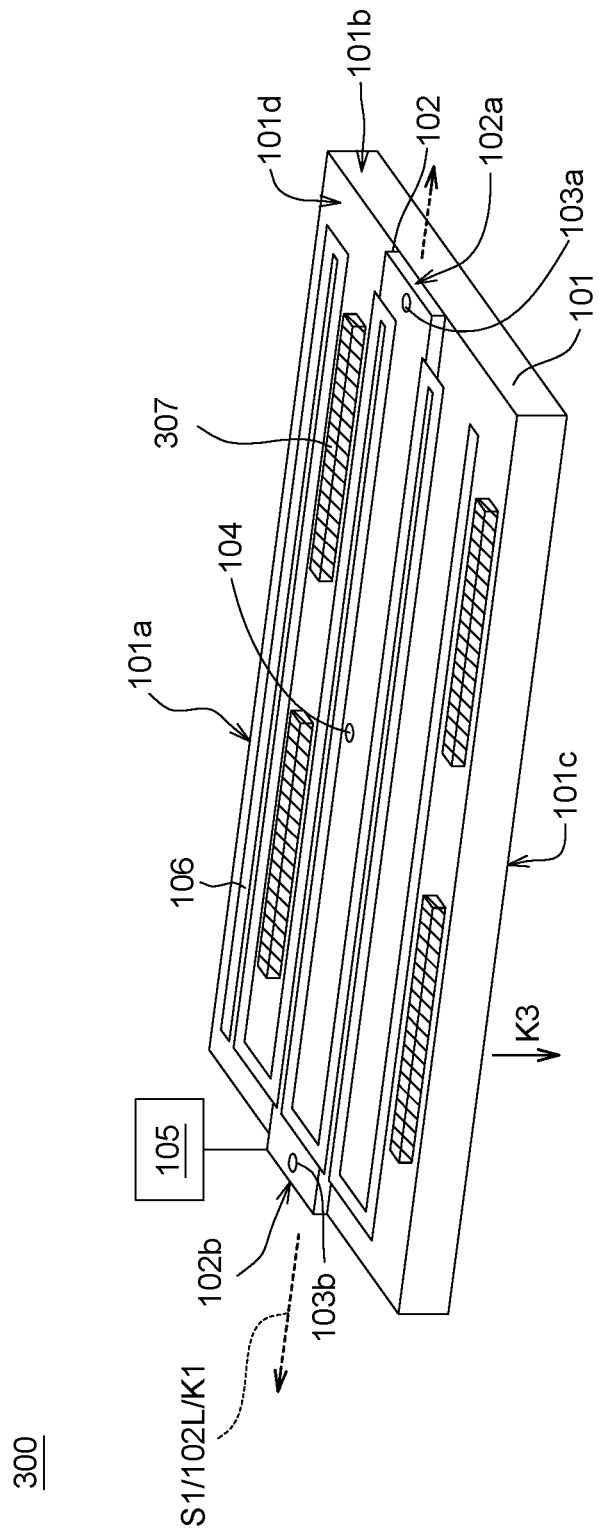
FIG. 3 is a perspective view illustrating a flexible display apparatus according to yet another embodiment of the present disclosure.

In order to further control the curvature and/or angle of the flexible display panel 101 after bending/deformation, the flexible display apparatus 300 may further include at least one elastic sheet 307. For example, FIG. 3 is a perspective view illustrating a flexible display apparatus 300 according to yet another embodiment of the present disclosure. The structure of the flexible display apparatus 300 is generally similar to that of the flexible display apparatus 100, the difference is that the flexible display apparatus 300 further includes a plurality of elastic sheets 307, which are conformally arranged on the back surface 101d of the flexible display panel 101 to provide elastic force to enhance (or to prevent) the shape of the flexible display panel 101 maintaining the curved state.

For example, in the present embodiment, when the first shape-memory metal element 102 and the second shape-memory metal element 202 are at the first temperature (i.e., 35° C.), since the tensile force provided both by the first shape-memory metal element 102 and the second shape-memory metal element 202 is greater than the elastic force provided by the elastic sheet 307, thus the first shape-memory metal element 102 and the second shape-memory metal element 202 can drive the flexible display panel 101 to have a curvature radius, that is larger than a curvature radius (not shown) of the flexible display panel 101 at the normal temperature (e.g., 25° C.). When the first shape-memory metal element 102 and the second shape-memory metal element 202 are at a fourth temperature (for example, around the normal temperature 25° C.), the first shape-memory metal element 102 and the second shape-memory metal element 202 are no longer provide the flexible display panel 101 any stress, or the stress provided is smaller than the elastic force provided by the elastic sheet 307. At this time, the elastic force provided by the elastic sheet 307 can drive the flexible display panel 101 to return to its original shape (bent state), so that the flexible display panel 101 may have a curvature radius (not drawn) smaller than that at the first temperature.

Figure 4:
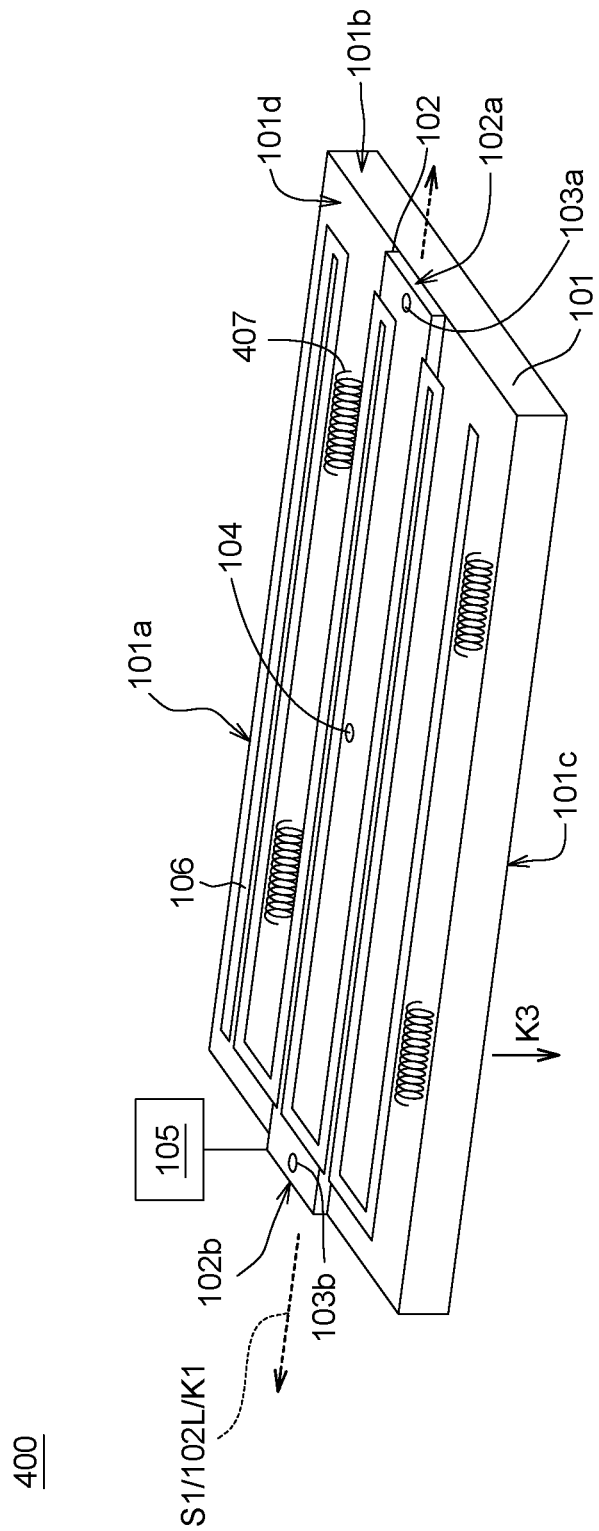
FIG. 4 is a perspective view illustrating a flexible display apparatus according to yet another embodiment of the present disclosure.

FIG. 4 is a perspective view illustrating a flexible display apparatus 400 according to yet another embodiment of the present disclosure. The structure of the flexible display apparatus 400 is generally similar to that of the flexible display apparatus 100, the difference is that the flexible display apparatus 400 further includes a plurality of spring members 407 disposed at the back surface 101d of the flexible display panel 101 arranged along the extending direction (long side direction) of the long side 101a of the flexible display panel 101 to provide an elastic force to enhance (or to prevent) the flexible display panel 101 returning to its original shape.

Figure 5:
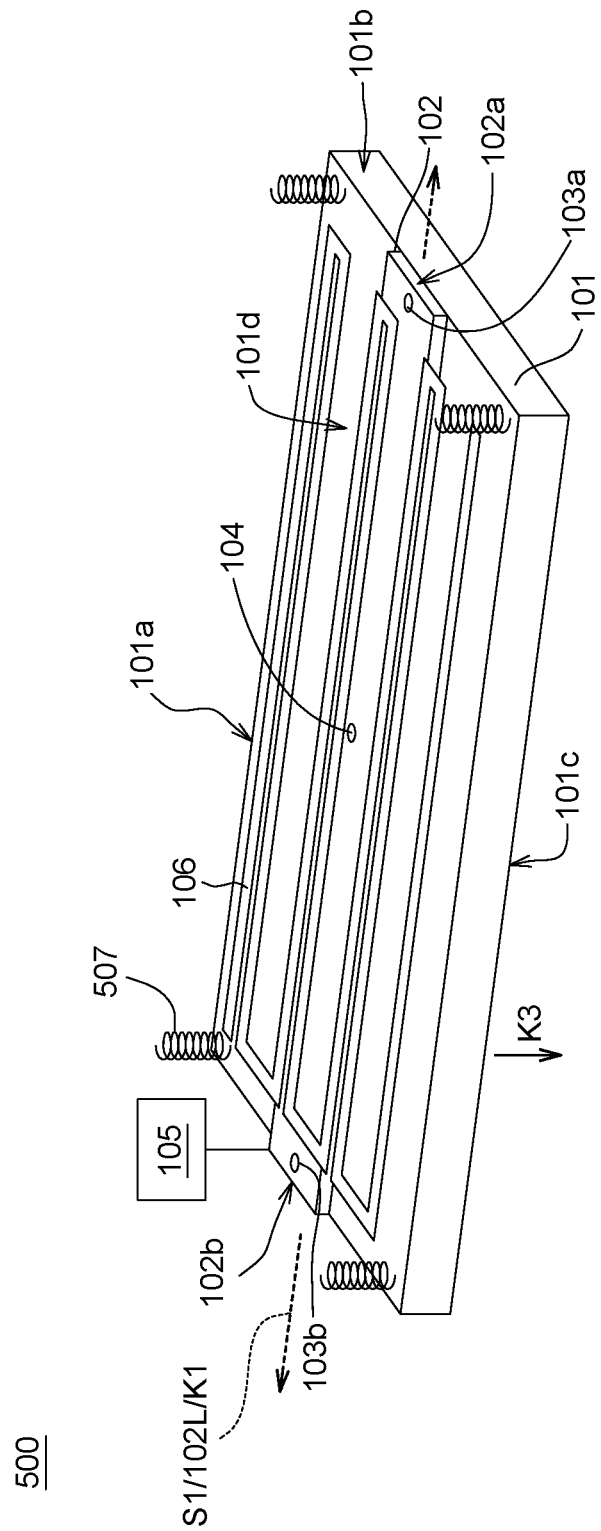
FIG. 5 is a perspective view illustrating a flexible display apparatus according to yet another embodiment of the present disclosure.

FIG. 5 is a perspective view illustrating a flexible display apparatus 500 according to yet another embodiment of the present disclosure. The structure of the flexible display apparatus 500 is generally similar to that of the flexible display apparatus 100, the difference is that the flexible display apparatus 500 further includes a plurality of spring members 507 extending along the displaying direction (the direction perpendicular to the display surface 101c) K3 of the flexible display panel 101 and disposed at the back surface 101d of the flexible display panel 101 to provide an elastic force to enhance (or to prevent) the flexible display panel 101 returning to its original shape.

Figure 6:
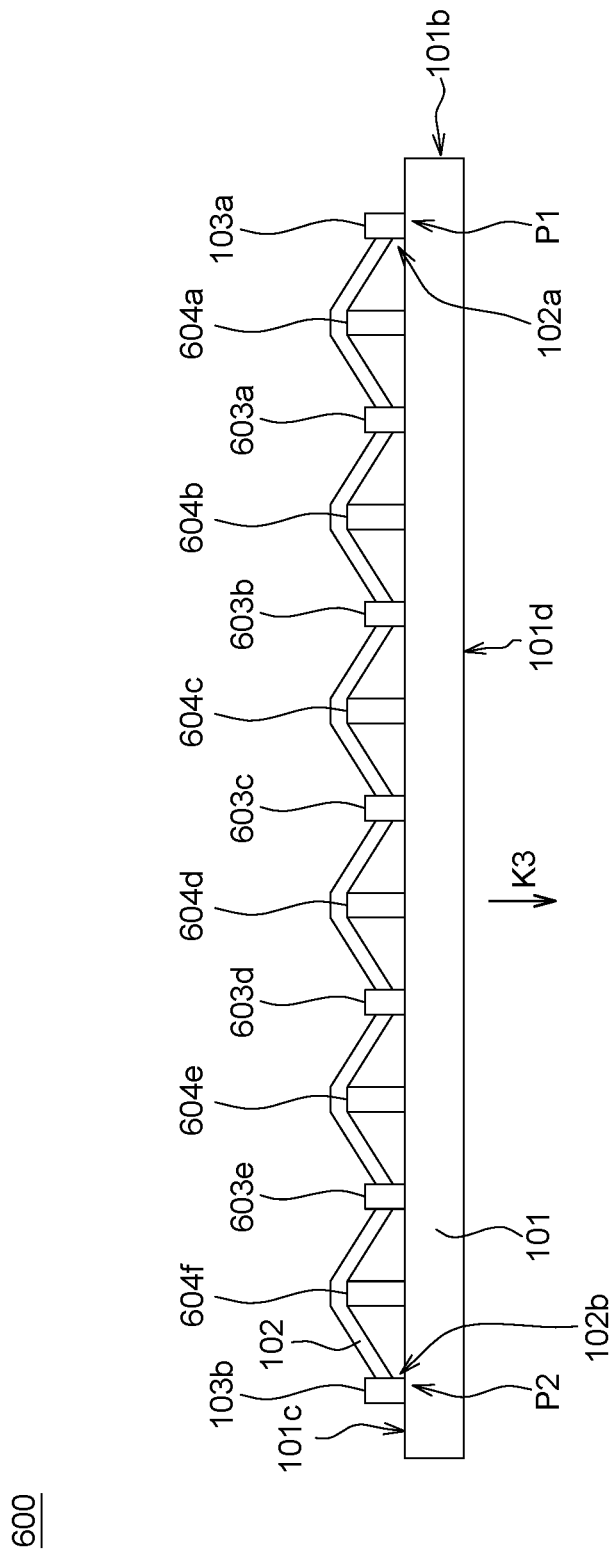
FIG. 6 is a cross-sectional view illustrating a flexible display apparatus according to yet another embodiment of the present disclosure.

FIG. 6 is a cross-sectional view illustrating a flexible display apparatus 600 according to yet another embodiment of the present disclosure. The structure of the flexible display apparatus 600 is generally similar to that of the flexible display apparatus 100, the difference is that the flexible display apparatus 600 further includes a plurality of anchoring members 603a-603e and a plurality of main support members 604a-604f disposed between the first end-anchoring member 103a and the end-second anchoring member 103b.

In the present embodiment, the main support members 604a-604f are disposed between two ones of the adjacent anchoring members, respectively. Since the materials, structures and arrangements of the anchoring members 603a-603e and the main support members 604a-604f, are respectively the same or similar to those of first end-anchoring member 103a, the second end-anchoring member 103b and the first main support member 104 of the deformable display device 100, thus no more details thereof is redundantly described here.

According to the aforementioned embodiments, a flexible display apparatus is provided, which is equipped with at least one shape-memory metal element on a flexible display panel. One end of a long axis of the shape-memory metal element is anchored at a first position of the flexible display panel, and the other end of the long axis is anchored at a second position of the flexible display panel. The first position and the second position are arranged along a connecting direction of the flexible display panel parallel to an extending direction (long side direction) of the long axis. When the shape-memory metal element is at a first temperature, a first deformation occurs on the shape-memory metal element along the long axis to drive the flexible display panel having a first curvature radius. When the shape-memory metal element is at a second temperature, a second deformation occurs on the shape-memory metal element along the long axis to drive the flexible display panel having a second curvature radius. By this approach, the bending/bending deformation degree of the display surface of the flexible display panel can be controlled more precisely and diversely, and the required curvature and/or display angle can be obtained. In some embodiments, even a portion (such as the right side portion) of the flexible display panel is flat, the other side (for example, the right side) can be bent to have a curved deformation, so as to prevent the right side portion of the flexible display panel from being peeped by others.

In some other embodiments, elastic sheets and/or springs extending along the long side direction or perpendicular to the display direction of the flexible display panel can be further arranged to provide an elastic force making the flexible display panel having the mechanical reliability for returning to its original shape after repeated bending. Such that the required curvature and/or display angle can be obtained.

While the invention has been described by way of example and in terms of the preferred embodiment (s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A flexible display apparatus, comprising:
a flexible display panel, having a long side direction; and
a first shape-memory metal element, having a first long axis; wherein one end of the first long axis is anchored to a first position of the flexible display panel, the other end of the first long axis is anchored to a second position of the flexible display panel, and the first position and the second position are arranged along a first connecting direction and the first connecting direction is parallel to the long side direction of the flexible display panel;
when the first shape-memory metal element is at a first temperature, a first deformation occurs along the first long axis to drive the flexible display panel having a first curvature radius;
wherein the one end of the first long axis is anchored to the first position by a first end-anchoring member, the other end of the first long axis is anchored to the second position by a second end-anchoring member; when the first deformation occurs, the first shape-memory metal element drives the flexible display panel to have a first curvature radius; and
at least one first main support member disposed between the first end-anchoring member and the second end-anchoring member for supporting the first shape-memory metal element.

2. The flexible display apparatus according to claim 1, further comprising a second shape-memory metal element having a second long axis, wherein one end of the second long axis is anchored to a third position of the flexible display panel through a third end-anchoring member, the other end of the second long axis is anchored to a fourth position of the flexible display panel through a fourth end-anchoring member;
wherein the third position and the fourth position are arranged along a second connecting direction parallel to the extending direction of the long side of the flexible display panel;
when the second shape-memory metal element is at the first temperature, a second deformation occurs on the shape-memory metal element along the second long axis to drive the flexible display panel having the first curvature radius.

3. The flexible display apparatus according to claim 2, wherein when the second shape-memory metal element is at a second temperature, a third deformation occurs on the second shape-memory metal element along the second log axis to drive the flexible display panel having a second curvature radius different from the first curvature radius.

4. The flexible display apparatus according to claim 2, further comprising a second main support member disposed between the third end-anchoring member and the fourth end-anchoring member for supporting the second shape-memory metal element.

5. The flexible display apparatus according to claim 1, further comprising a power supply to provide current passing through the first shape-memory metal element to make the first shape-memory metal element at the first temperature.

6. The flexible display apparatus according to claim 1, wherein when the first shape-memory metal element is at a third temperature, a fourth deformation occurs on the first shape-memory metal element along the first long axis, to drive the flexible display panel having a third curvature radius less than the first curvature radius.

7. The flexible display apparatus according to claim 6, further comprising a cooler used to reduce a temperature of the first shape-memory metal element or the second shape-memory metal element from the first temperature down to the third temperature, so as to make the flexible display panel having the third curvature radius.

8. The flexible display apparatus according to claim 1, further comprising an elastic sheet disposed adjacent to a back surface of the flexible display panel to provide an elastic force; when the first shape-memory metal element is at a third temperature, the flexible display panel has a third curvature radius less than the first curvature radius.

9. The flexible display apparatus according to claim 1, wherein the first shape-memory metal element and the second shape-memory metal element are plural.

10. A flexible display apparatus, comprising:
a flexible display panel, having a long side direction; and
a plurality of first shape-memory metal elements, one of which has an end anchored to a first position of the flexible display panel and another end anchored to a second position of the flexible display panel;
a plurality of second shape-memory metal element, one of which has an end anchored to a third position of the flexible display panel, and another end anchored to a fourth position of the flexible display panel;
when at least a portion of the plurality of the first shape-memory metal elements and/or a portion of the plurality of the second shape-memory metal elements are at a first temperature, a first deformation occurs on the portion of the plurality of the first shape-memory metal elements and/or a second deformation occurs on the portion of the plurality of the second shape-memory metal elements to drive the flexible display panel having a first curvature radius;
wherein the one of the plurality of first shape-memory metal elements has a first long axis; one end of the first long axis is anchored to the first position by a first end-anchoring member, the other end of the first long axis is anchored to the second position by a second end-anchoring member; when the first deformation occurs on the portion of the plurality of the first shape-memory metal elements, the flexible display panel is driven having the first curvature radius; and
at least one first main support member disposed between the first end-anchoring member and the second end-anchoring member for supporting the portion of the plurality of the first shape-memory metal elements.

11. The flexible display apparatus according to claim 10, wherein the one of the plurality of second shape-memory metal elements has a second long axis; one end of the second long axis is anchored to the third position by a third end-anchoring member, the other end of the second long axis is anchored to the fourth position by a fourth end-anchoring member; and the flexible display apparatus further comprising at least one second main support member disposed between the third end-anchoring member and the fourth end-anchoring member for supporting the portion of the plurality of the second shape-memory metal elements.

12. The flexible display apparatus according to claim 10, wherein when the portion of the plurality of second shape-memory metal elements are at a second temperature, a third deformation occurs on the portion of the plurality of second shape-memory metal elements along the second log axis to drive the flexible display panel having a second curvature radius different from the first curvature radius.

13. The flexible display apparatus according to claim 10, wherein when the portion of the plurality of the first shape-memory metal elements and/or the portion of the plurality of the second shape-memory metal elements are at a third temperature, a fourth deformation occurs on the portion of the plurality of the first shape-memory metal elements along the first long axis; and/or a fifth deformation occurs on the portion of the plurality of the second shape-memory metal element along the second log axis, to drive the flexible display panel having a third curvature radius less than the first curvature radius.

* * * * *